United States Patent
Yi et al.

(10) Patent No.: US 10,707,358 B2
(45) Date of Patent: Jul. 7, 2020

(54) SELECTIVE SHIELDING OF AMBIENT LIGHT AT CHIP LEVEL

(71) Applicant: GLOBALFOUNDRIES Singapore Pte. Ltd., Singapore (SG)

(72) Inventors: Wanbing Yi, Singapore (SG); Juan Boon Tan, Singapore (SG); Kiok Boone Elgin Quek, Singapore (SG); Khee Yong Lim, Singapore (SG); Chim Seng Seet, Singapore (SG); Rajesh Nair, Santa Clara, CA (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 98 days.

(21) Appl. No.: 16/027,363

(22) Filed: Jul. 4, 2018

(65) Prior Publication Data

US 2020/0013908 A1    Jan. 9, 2020

(51) Int. Cl.
*H01L 31/0216*    (2014.01)
*H01L 23/00*    (2006.01)

(52) U.S. Cl.
CPC .......... *H01L 31/0216* (2013.01); *H01L 24/03* (2013.01); *H01L 2224/02206* (2013.01); *H01L 2224/0391* (2013.01)

(58) Field of Classification Search
None
See application file for complete search history.

(56) References Cited

U.S. PATENT DOCUMENTS

| | | | |
|---|---|---|---|
| 3,969,751 A | 7/1976 | Drukaroff et al. | |
| 6,448,632 B1 | 9/2002 | Takiar et al. | |
| 6,630,736 B1 | 10/2003 | Ignaut | |
| 6,775,174 B2 | 8/2004 | Huffman et al. | |
| 9,515,111 B2 | 12/2016 | Borthakur et al. | |
| 9,818,776 B2 | 11/2017 | Borthakur et al. | |
| 2012/0292730 A1* | 11/2012 | Tsai | H01L 23/5226 257/443 |
| 2013/0032916 A1* | 2/2013 | Lin | H01L 27/14683 257/435 |
| 2017/0025471 A1* | 1/2017 | Bhushan | H01L 43/12 |

OTHER PUBLICATIONS

K.Y. Inoue et al., Advanced LSI-based amperometric sensor array with light-shielding structure for effective removal of photocurrent and mode selectable function for individual operation of 400 electrodes, Lab on a Chip, Feb. 25, 2015, 2-37, Royal Society of Chemistry, Cambridge, United Kingdom.

* cited by examiner

*Primary Examiner* — Mounir S Amer
(74) *Attorney, Agent, or Firm* — David Cain

(57) ABSTRACT

A semiconductor device having a substrate with at least one photo-detecting region and at least one bond pad is provided. A first passivation layer is deposited over the substrate and over step portions at the edges of the bond pad and a trench having sidewalls and a bottom surface is formed in the substrate. A light shielding layer is deposited over the first passivation layer and covering the trench sidewalls. The light shielding layer has end portions at the photo-detecting region, at step portions at the edges of the bond pad and at the bottom surface of the trench. A second passivation layer is deposited over the light shielding layer. A third passivation layer is deposited over the end portions of the light shielding layer at the photo-detecting region and at the step portions at edges of the bond pad.

12 Claims, 5 Drawing Sheets

SELECTIVE SHIELDING OF AMBIENT LIGHT AT CHIP LEVEL

FIELD OF THE INVENTION

The presently disclosed subject matter relates generally to electromagnetic shielding for semiconductor devices, and more particularly to the selective shielding of the visible light range of the electromagnetic spectrum for semiconductor devices.

BACKGROUND

The effects of electromagnetic interference (EMI) have significant impact on a wide variety of electrical and electronic systems that are used in everyday life, as well as in military and space exploration applications and activities. In particular, EMI, together with electro-migration and electrostatic discharge, can impact the safe and reliable operation of semiconductor devices.

EMI can affect an electrical circuit by, among other ways, causing electromagnetic induction, electrostatic coupling and/or conduction. Such disturbances may degrade the performance of the electrical circuit or even stop it from functioning. In the case of a data path, these effects can range from an increase in error rate to a total loss of the data, for example, from the effects of ultraviolet rays. An unshielded semiconductor device will tend to act as a detector for EMI (for example, radio signals) commonly found in the domestic environment. Light emitting diode (LED) lighting, for example, is a known source of EMI. Therefore, it is desirable to prevent, to an acceptable degree, the effects of ambient light that can alter the electrical characteristics of such light sensitive devices.

Conventionally, EMI shielding of semiconductor devices uses metal or polymer casings with a thin metal layer applied to the inside of the casing and affixed to a printed circuit board (PCB) to resolve EMI issues. This type of PCB-level shielding encapsulates the entire semiconductor device.

There are, however, semiconductor devices in combination with photonic components, which still require selective exposure to ambient light. Thin film photoelectric conversion devices are integrated with other semiconductor devices, which must be shielded from the ambient light. A new generation of electronic devices can be powered by energy harvesters such as photovoltaics, for example, self-sufficient wrist watches to wireless sensors that obtain power from the environment they are placed in. Other electronic devices, for example, ambient light sensors that control the display luminosity of mobile phones depending on ambient brightness and wearable devices such as smart goggles or smart contact lenses that project a miniature display of information in front of your eyes.

As such, PCB-level shielding will not meet the requirements of semiconductor devices with photonic components as the photonic components still require selective exposure to ambient light to function.

SUMMARY

To achieve the foregoing and other objectives of the present disclosure, structures and methods are used for selectively permitting ambient light exposure onto a semiconductor device by isolating photo-sensitive circuits through the use of a light shielding layer that block ambient light from reaching such circuits.

The present disclosure is directed to the integration of a light shielding layer with passivation layers to generally isolate ambient light from the front side of a semiconductor device, the selective opening of the light shielding layer to permit ambient light to enter certain regions of the semiconductor device, and the use of a deep trench to prevent ambient light from entering the semiconductor device through its sides. The light shielding layer is preferably a conductive material, as it is more efficient in shielding ambient light than non-conductive material, and therefore needs to be electrically isolated by passivation layers from other conductive components on the semiconductor device, such as bond pads, solder bumps and interconnects. As it is also desirable to minimize the processing costs in fabricating the light shielding layer, the methods of fabrication disclosed herein allow for self-aligned device structures and will require the use of only two lithographic masks.

According to an aspect of the present disclosure, a semiconductor device is provided. The semiconductor device having a substrate with at least one photo-detecting region, at least one bond pad on the substrate, a first passivation layer over the substrate and over step portions at the edges of the bond pad, a deep trench having sidewalls and a bottom surface in the substrate at a perimeter of the device and a light shielding layer over the first passivation layer, covering the substrate and the step portions at the edges of the bond pad and covering the deep trench sidewalls. The light shielding layer has end portions at the photo-detecting region, at step portions at the edges of the bond pad and at the bottom surface of the deep trench. A second passivation layer is deposited over the light shielding layer and a third passivation layer over the second passivation layer, covering the end portions of the light shielding layer at the photo-detecting region and at the step portions at edges of the bond pad.

According to another aspect of the present disclosure, a method of fabricating a semiconductor device is provided, which includes providing a substrate and forming at least one photo-detecting region in the substrate. Disposing at least one bond pad on the substrate and depositing a first passivation layer over the substrate and over the bond pad. Forming a deep trench with a bottom surface in the substrate enclosing the photo-detecting region and the bond pad at a perimeter of the device. Following which, depositing a light shielding layer over the first passivation layer and lining the deep trench, and depositing a second passivation layer over the light shielding layer. Selectively etching the second passivation layer, the light shielding layer and a portion of the first passivation layer from the bond pad to partially expose the bond pad and form step portions at edges of the bond pad, wherein end portions of the light shielding layer are exposed at the steps portions at the edges of the bond pad. Selectively etching the second passivation layer, the light shielding layer and a portion of the first passivation layer from the photo-detecting region to partially expose the photo-detecting region, wherein end portions of the light shielding layer are exposed at the photo-detecting region. Depositing a third passivation layer over the end portions of the light shielding layer at the step portions at the edges of the bond pad and at the photo-detecting region.

According to yet another aspect of the present disclosure, the present semiconductor device will not be encapsulated with external casings to permit the photo-detecting region to be exposed to the ambient light.

BRIEF DESCRIPTION OF THE DRAWINGS

The embodiments of the present disclosure will be better understood from a reading of the following detailed description, taken in conjunction with the accompanying drawings.

Figure 1:
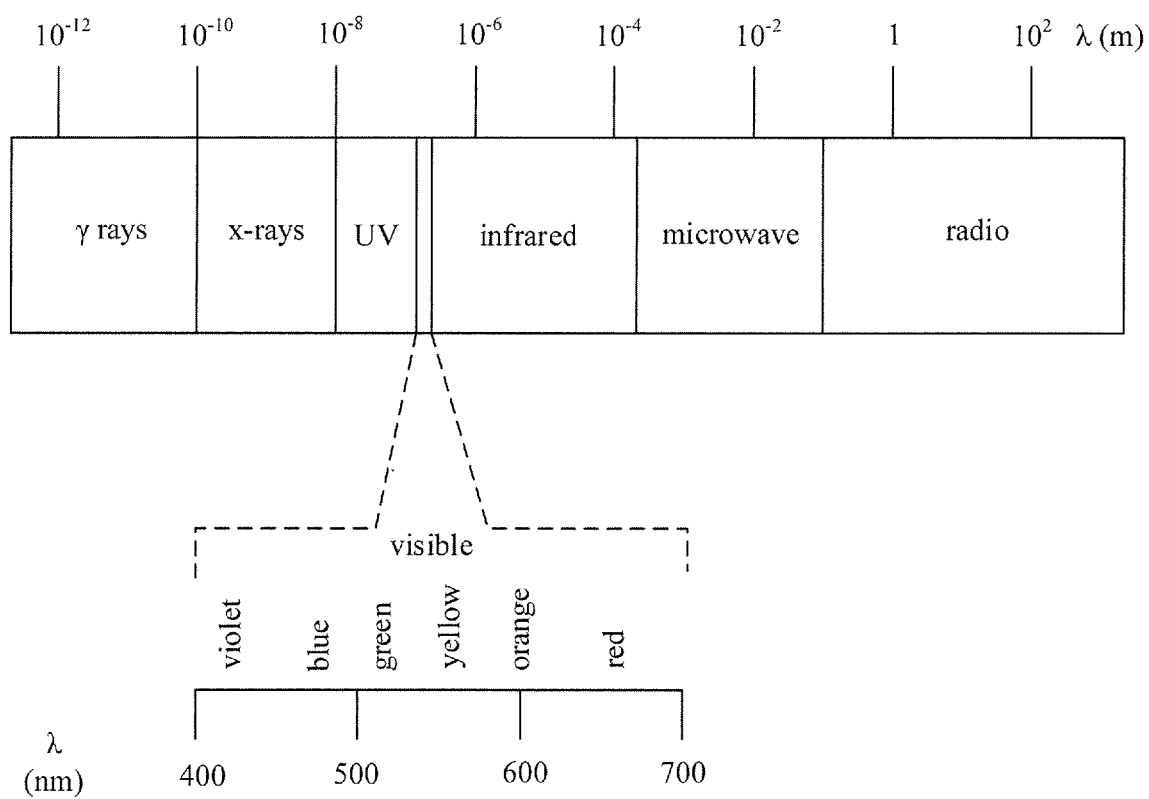
FIG. 1 is an illustration of an electromagnetic spectrum, particularly depicting the wavelengths of the visible light range.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of the embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the applications and uses of the device. Furthermore, there is no intention to be bound by any theory presented in the preceding background of the device or the following detailed description.

Structures and methods are disclosed for permitting ambient light exposure onto photonic components in a semiconductor device while isolating ambient light from photo-sensitive circuits through the use of a light shielding layer.

FIG. 1 is an illustration of an electromagnetic spectrum, particularly depicting the wavelengths of the visible light range. The visible light wavelengths range from 400 nm to 700 nm. The terms "visible light" and "ambient light" should be understood to imply any available light in an environment and the terms are used interchangeably in the present disclosure. The disclosed light shielding layer is able prevent a range of wavelengths from affecting photo-sensitive circuits in the semiconductor device as it selectively allows exposure to ambient light, and therefore, additional shielding by encapsulating the semiconductor device is not required.

The light shielding layer is preferably a conductive material such as, for example, aluminum (Al), tungsten (W), tantalum (Ta), titanium (Ti), copper (Cu), tantalum nitride (TaN), titanium nitride (TiN), or a combination of these materials and other suitable conducting materials. In one embodiment of the disclosed device, the preferred light shielding layer is Ta, Ti or a mixture of Ta and Ti.

Figure 2:
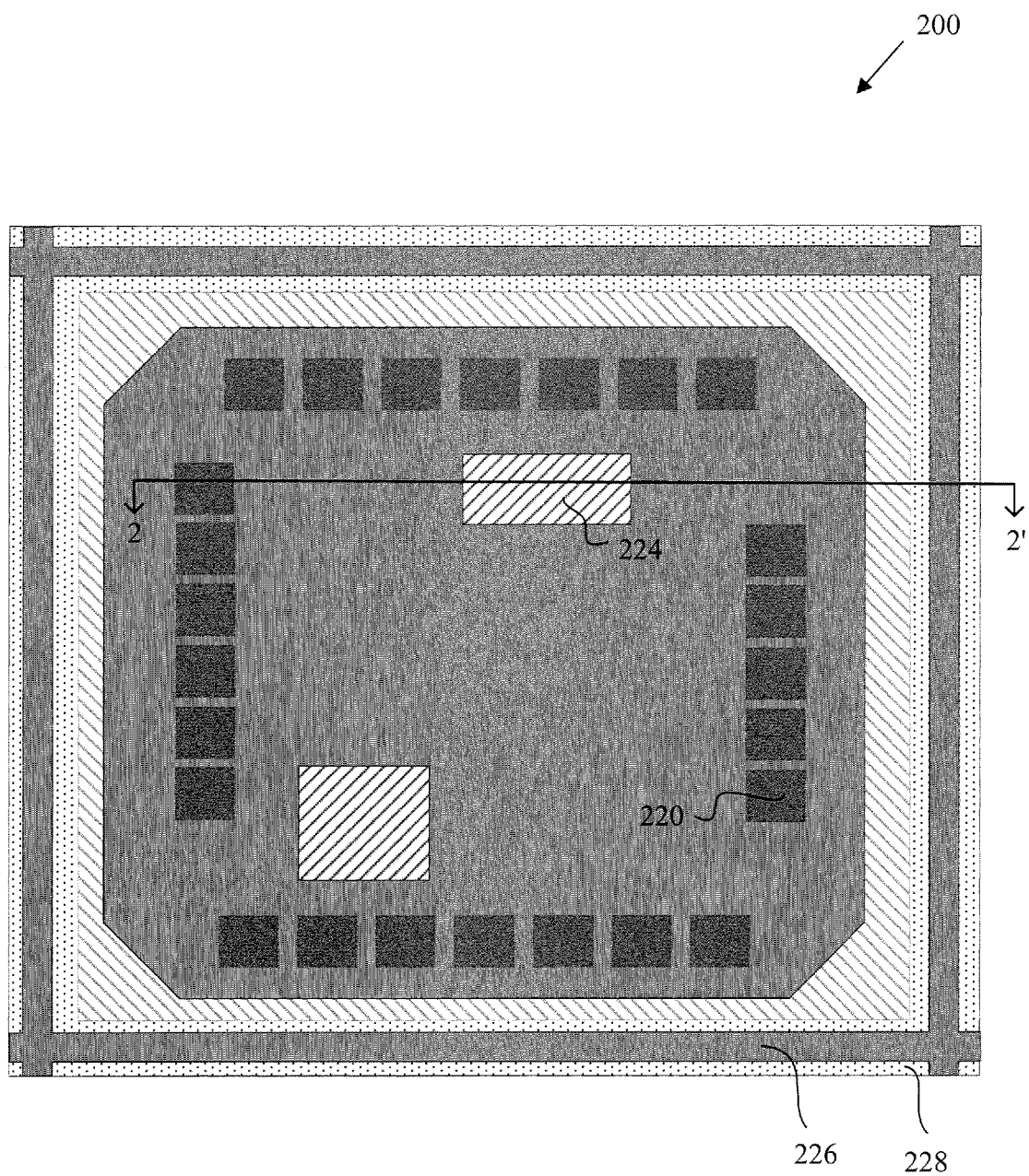
FIG. 2 is a top view of an embodiment of the disclosed semiconductor device before wafer dicing.

FIG. 2 is a top view of a semiconductor device 200, in accordance with embodiments of the device. The semiconductor device 200 is shown with a plurality of bond pads 220 on its periphery, photo-detecting regions 224 and a deep trench 226 in a scribe lane 228 at a perimeter of the semiconductor device 200. The bond pads 220 are adapted to electrically couple the semiconductor device 200 to other components via wire bonding, flip-chip bonding or other packaging methods. It should be understood that the number and placement locations of bond pads and photonic regions may vary according to the specific design of each semiconductor device.

Photonic components embedded in the substrate form photo-detecting regions. Photonic components can comprise optical modulators, photodetectors, optical isolators, surface grating couplers, convertors and/or splitters. The photonic components will receive ambient light and convert the ambient light into corresponding electrical signals.

FIGS. 3A-3E are cross-section views taken along line 2-2' (as indicated in FIG. 2 of a semiconductor device 200), in accordance with an embodiment of the device 200. FIGS. 3A-3E illustrate the various methods for fabricating the semiconductor device 200 having a light shielding layer to selectively permit exposure of ambient light onto the photonic components, while isolating other photo-sensitive circuits (not shown) in the semiconductor device 200. Also, in the illustrated embodiments, the methods described herein are not limited, and they may be applied to various types of light sensitive semiconductor devices. Certain structures may be conventionally fabricated, for example, using known processes and techniques and specifically disclosed processes and methods may be used to achieve individual aspects of the present disclosure.

Figure 3A:
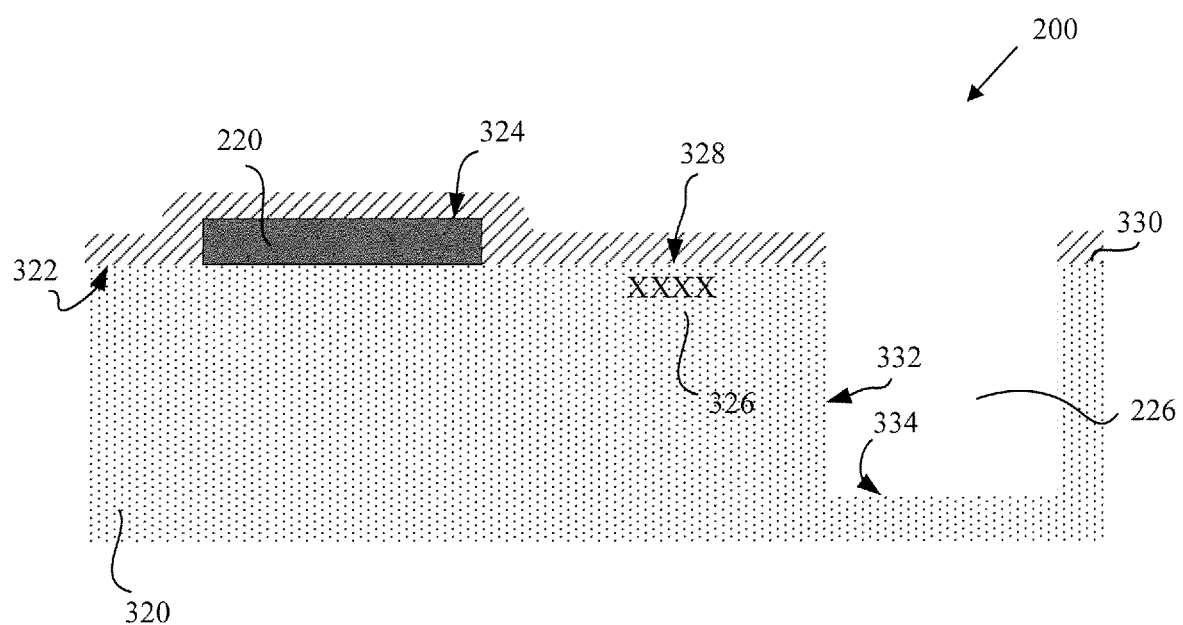
FIG. 3A-3E are cross-section views of embodiments of the disclosed semiconductor device (taken along line 2-2' as indicated in FIG. 2), depicting methods for forming the structures for selectively permitting ambient light exposure and isolating photo-sensitive circuits through the use of a light shielding layer.

FIG. 3A is a cross-section view of an embodiment of the semiconductor device 200 that is fabricated in a semiconductor substrate 320 with a substrate surface 322. The substrate 320 may be comprised of any appropriate semiconductor material, such as silicon, silicon/germanium, silicon/carbon, other II-VI or III-V semiconductor compounds and the like. The substrate 320 may be made of silicon or it may be made of materials other than silicon, for example, gallium arsenide, gallium phosphate or germanium. Thus, the terms "substrate" or "semiconductor substrate" should be understood to cover all typically used semiconducting materials and all forms of such materials. The transistors and interconnects are not shown for clarity.

As illustrated in FIG. 3A, the semiconductor device 200 comprises a bond pad 220 with bond pad surface 324 and a plurality of photonic components 326 forming a photo-detecting region 328 in the substrate 320. A first passivation layer 330 is deposited on the substrate surface 322 and over the bond pad surface 324. A deep trench 226 having sidewalls 332 and a bottom surface 334 is etched in the semiconductor substrate 320 using a first lithographic mask, adjacent to the photonic components 326 after the deposition of the first passivation layer 330. In this embodiment of the device, for example, the first passivation layer 330 is a semiconductor oxide, such as silicon dioxide ($SiO_2$) and the oxide thickness is about 5,000 Å. The depth of the deep trench 226 is about 60,000 Å deep and the width ranges from 30,000 Å to 40,000 Å.

Figure 3B:
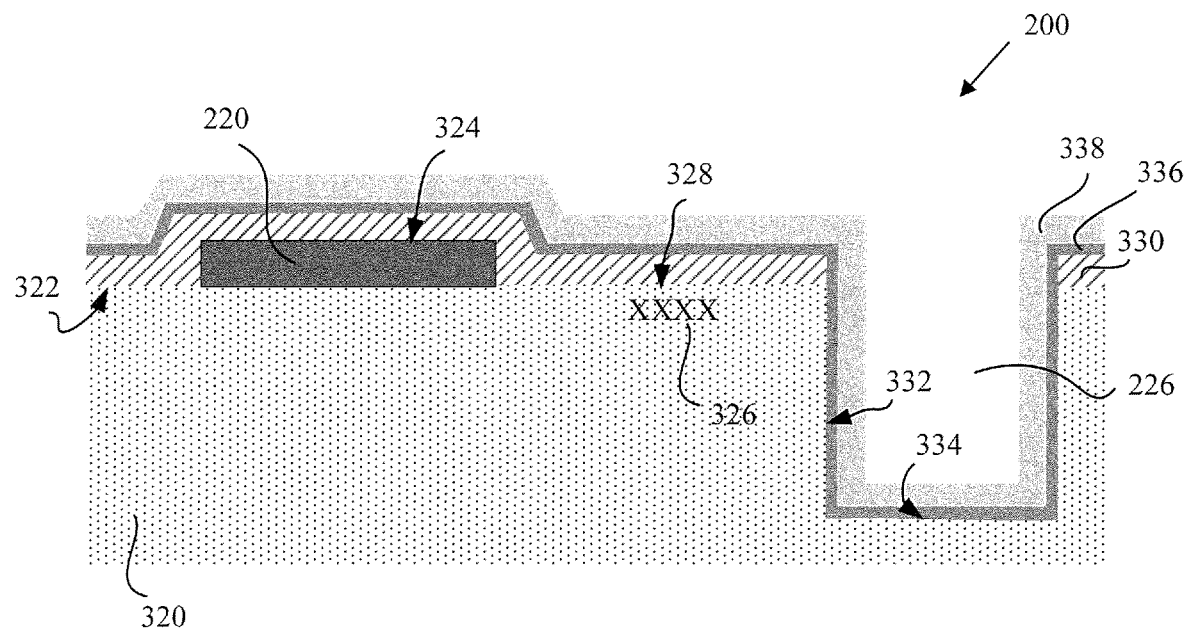

FIG. 3B illustrates another embodiment of the semiconductor device 200 after the deposition of a light shielding layer 336 and a second passivation layer 338. The light shielding layer 336 is conformally deposited over the first passivation layer 330, followed by another deposition process step to conformally deposit the second passivation layer 338 over the light shielding layer 336. During the respective deposition process steps, the light shielding layer 336 and the second passivation layer 338 are deposited in the deep trench 226, conformally covering the sidewalk 332 and the bottom surface 334. In this embodiment of the device, for example, the thickness of the light shielding layer 336 ranges from 200 Å to 500 Å to effectively block up to 95% of the ambient light. The second passivation layer 338 is a silicon nitride (SiN) layer and the thickness is about 5,000 Å.

Figure 3C:
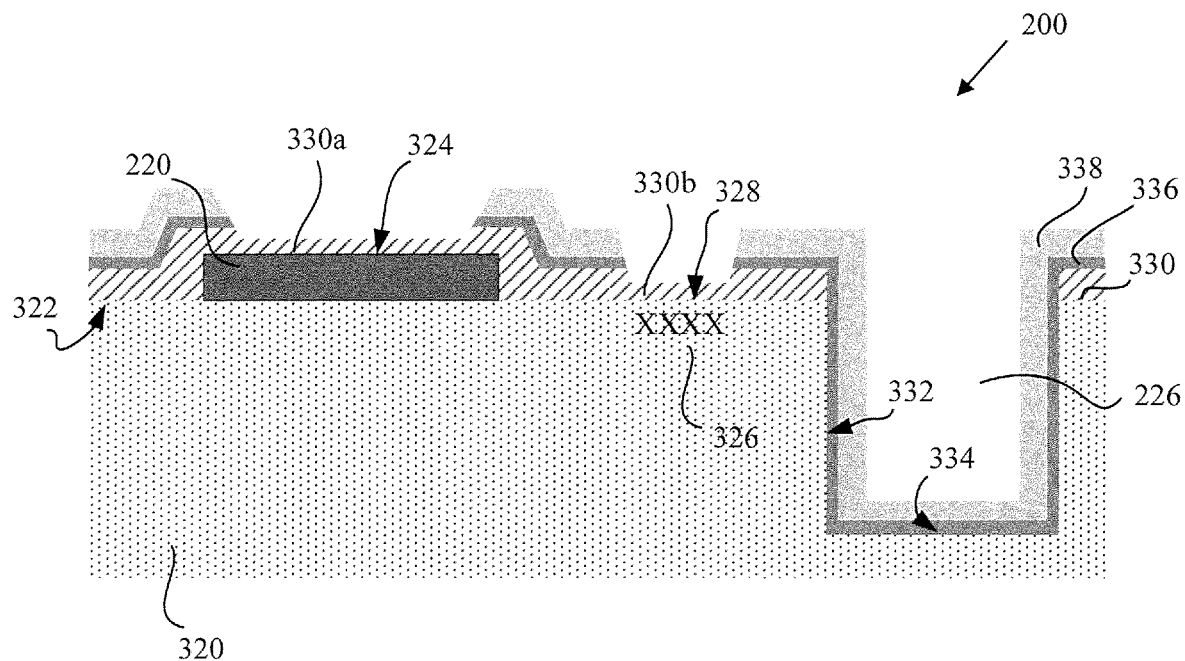

FIG. 3C illustrates a further embodiment of the semiconductor device 200 after partially removing the first passivation layer 330 and all of the light shielding layer 336 and the second passivation layer 338 from the bond pad surface 324 and from the photo-detecting region 328. By using a second lithographic mask and at least one material removing process step, a bond pad opening and a photo-detecting region opening are defined. The bond pad opening can be defined simultaneously with the photo-detecting region, or the openings can be defined sequentially. The second passivation layer 338 and the light shielding layer 336 are removed completely, leaving behind a portion of the first passivation layer 330 covering the bond pad surface 324 and the photo-detecting region 328. The second passivation layer 338, the light shielding layer 336 and the portion of the first passivation layer 330 can be removed individually in separate process steps or the layers can be removed in one process step. An example of the process used to remove the layers is an anisotropic plasma etch process. It is an objective of the present disclosure to have the underlying substrate surfaces 322, 328 and 334 and other surfaces be left undamaged during the material removing process steps by adjusting the selectivity of those removal processes.

The second passivation layer 338 and the light shielding layer 336 have end portions at step portions located at the edges of the bond pad 220 as a result of the material removing process. In this embodiment of the device, there is about 2,000 Å of the first passivation layer 330 remaining on the bond pad surface 324 and the photo-detecting region 328, which are shown as 330a and 330b, respectively. This remaining portion 330a of the first passivation layer 330 on the bond pad surface 324 is purposefully left to protect the bond pad surface 324, so as to subject the bond pad surface 324 to only one instance of plasma damage from the material removing process steps. The deep trench 226 is also being protected from the material removing process step by depositing a thick layer of photoresist (not shown), such that the light shielding layer 336 and second passivation layer 338 in the deep trench 226 remain undamaged.

Figure 3D:
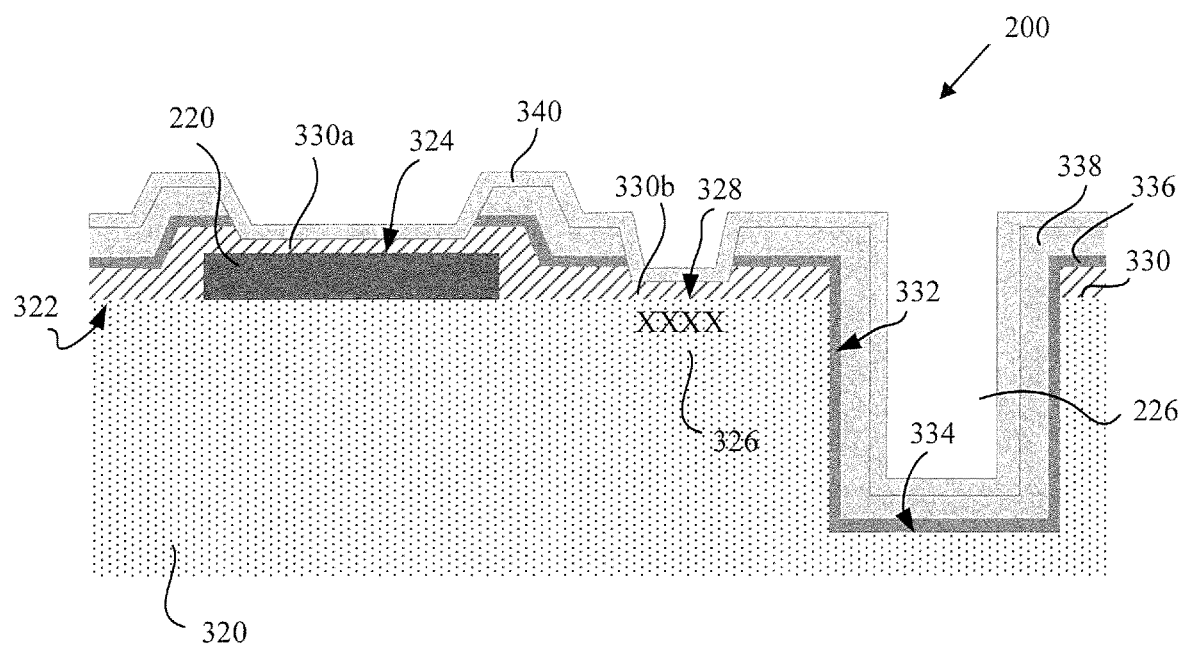

FIG. 3D illustrates another further embodiment of the semiconductor device 200 after depositing a third passivation layer 340. The thickness of the material to be deposited for the third passivation layer may vary according to the specific isolation requirement of each semiconductor device and the material used can be the same or different from the passivation material used for the second passivation layer 338. In this embodiment of the device, the second and third passivation layers are formed of the same material and about 3,000 Å of the passivation material is added to form layer 340. The third passivation layer 340 is the pre-step to the formation of the self-aligned isolation of the light shielding layer 336. As the light shielding layer 336 is preferably a conductive material, the light shielding layer 336 needs to be electrically isolated from any other conductive components, such as packaging outputs of wires, interconnect lines or solder balls, and the third passivation layer performs this function. The light shielding layer 336 is used to line the deep trench 226 and is grounded to the substrate 320 (not shown), limiting any build-up of electrostatic charges.

Figure 3E:
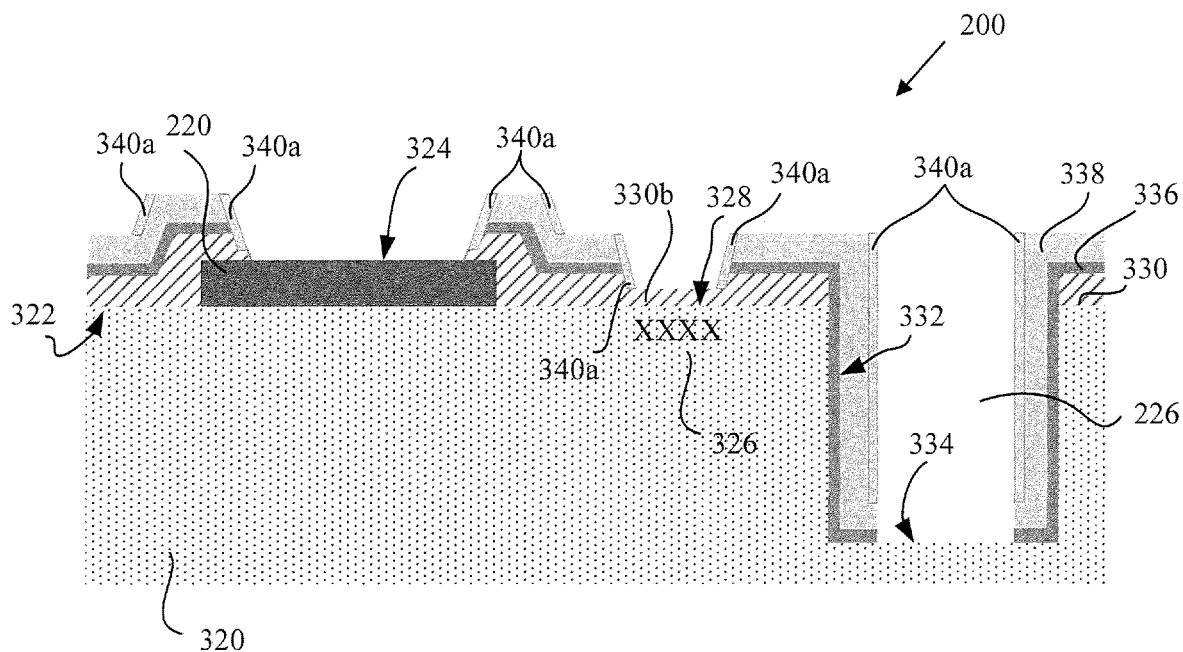

FIG. 3E illustrates a yet further embodiment of the semiconductor device 200. Several features of the present disclosure are formed after removing portions of the first passivation layer 330, removing portions of the second passivation layer 338, removing most of the third passivation layer 340, except for sidewall portions which are shown as 340a, and removing portions of the light shielding layer 336. The bond pad surface 324 is exposed by removing the third passivation layer 340 and the portion of the first passivation layer 330a and can now be electrically coupled to other components via wire bonding, flip-chip bonding or the other methods.

The light detecting region 328 has the third passivation layer 340 removed, leaving behind remaining portion 330b of the first passivation layer on the photo-detecting region 328. The absence of the light shielding layer permits ambient light to enter the semiconductor device 200 to be detected by the photonic components 326. The electrical isolation of the light shielding layer 336 by the first passivation layer 330 and the second passivation layer 338 is formed, with the end portions of the light shielding layer 336 and the end portions of the second passivation layer 338 covered by the sidewall portions of the third passivation layer 340a. The electrical isolation of the light shielding layer 336 is achieved using a self-alignment method. This self-alignment method eliminates the need to align the third passivation layer 340 to cover the end portions of the light shielding layer 336 during the fabrication process. The final structure of the deep trench 226 is shown lined with the light shielding layer 336 and the second passivation layer 338, isolating ambient light from reaching the photonic components 326.

The presence of a conductive material, such as the light shielding layer, in a scribe lane 228 (as illustrated in FIG. 2) can pose challenges during wafer dicing, especially when using laser-based techniques. The laser light may be partly reflected by the light shielding layer 336 lining the deep trench 226 and affect the wafer dicing accuracy. For that reason, the light shielding layer 336 and the second passivation layer 338 are removed from the bottom surface 334 of the deep trench 226 before wafer dicing.

As presented in the above detailed description, ambient light will be isolated from the photo-sensitive circuits in the substrate through the use of the light shielding layer integrated in the passivation layer on the front side of the semiconductor device. For semiconductor devices with the photonic components that require exposure to ambient light, the selective opening of the light shielding layer will permit the ambient light to reach those photonic components. Sides of the semiconductor devices are also isolated from ambient light through the use of a deep trench that is lined with the light shielding layer.

The terms "first", "second", "third" and the like in the description and in the claims, if any, are used for distinguishing between similar elements and not necessarily for describing a particular sequential or chronological order. In addition, the terms "top", "bottom", "over", "under", and the like in the description and in the claims, if any, are used for descriptive purposes and not necessarily for describing permanent relative positions. It is to be understood that the aforementioned terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
   a substrate;
   at least one photo-detecting region formed in the substrate;
   at least one bond pad on the substrate;
   a first passivation layer over the substrate and over step portions at edges of the bond pad;
   a trench having sidewalls and a bottom surface in the substrate;
   a light shielding layer over the first passivation layer covering the substrate and the step portions at the edges of the bond pad and covering the trench sidewalls, wherein portions of the light shielding layer are removed forming end portions thereof at the photo-detecting region, at the step portions at the edges of the bond pad and at the bottom surface of the trench;
   a second passivation layer over the light shielding layer; and
   a third passivation layer over the second passivation layer and covering the end portions of the light shielding layer at the photo-detecting region and at the step portions at the edges of the bond pad.

2. The device of claim 1 wherein the device is unencapsulated and permits the photo-detecting region to be exposed to visible light.

3. The device of claim 1 wherein the light shielding layer is electrically isolated by the first, second and third passivation layers at the photo-detecting region.

4. The device of claim 1 wherein the light shielding layer is electrically isolated by the first, second and third passivation layers at the step portions at the edges of the bond pad.

5. The device of claim 1 wherein the trench is at a perimeter of the device.

6. The device of claim 1 wherein the light shielding layer is a conductive material.

7. The device of claim 1 wherein the light shielding layer comprises Ta, Ti or a mixture of Ta and Ti.

8. The device of claim 1 wherein the light shielding layer comprises TaN or TiN.

9. The device of claim 1 wherein the first passivation layer is an oxide layer.

10. The device of claim 1 wherein the second passivation layer is a SiN layer.

11. The device of claim 1 wherein the thickness of the light shielding layer ranges from 200 Å to 500 Å.

12. The device of claim 1 wherein the depth of the trench is about 60,000 Å and the width of the trench ranges from 30,000 Å to 40,000 Å.

* * * * *